(12) United States Patent
McInerny

(10) Patent No.: US 10,078,625 B1
(45) Date of Patent: Sep. 18, 2018

(54) INDEXING STORED DOCUMENTS BASED ON REMOVED UNIQUE VALUES

(75) Inventor: Michael J. McInerny, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 718 days.

(21) Appl. No.: 13/605,827

(22) Filed: Sep. 6, 2012

(51) Int. Cl.
G06F 17/30 (2006.01)
G06F 17/22 (2006.01)

(52) U.S. Cl.
CPC .............................. G06F 17/2247 (2013.01)

(58) Field of Classification Search
CPC ................................................... G06F 17/2247
See application file for complete search history.

(56) References Cited

U.S. PATENT DOCUMENTS

| | | | |
|---|---|---|---|
| 6,389,168 B2* | 5/2002 | Altunbasak et al. | 382/224 |
| 7,139,765 B1* | 11/2006 | Balkany | G06F 17/30327 |
| 2002/0120598 A1* | 8/2002 | Shadmon | G06F 17/30911 |
| 2003/0028509 A1* | 2/2003 | Sah et al. | 707/1 |
| 2007/0016401 A1* | 1/2007 | Ehsani | G10L 15/005 704/9 |
| 2008/0021914 A1* | 1/2008 | Davies et al. | 707/101 |
| 2008/0114724 A1* | 5/2008 | Indeck et al. | 707/2 |
| 2009/0287986 A1* | 11/2009 | Vishniac et al. | 714/819 |
| 2013/0024433 A1* | 1/2013 | Amit et al. | 707/693 |

OTHER PUBLICATIONS

"Unique Key," by Wikipedia (revision Apr. 18, 2011). Available at: http://en.wikipedia.org/w/index.php?title=Unique_key&oldid=424604692.*
"SQL Unique Constraint," by w3schools.com (wayback machine date to Jun. 4, 2011). Original URL at: http://www.w3schools.com/Sql/sql_unique.asp.*

* cited by examiner

*Primary Examiner* — Hung Q Pham
(74) *Attorney, Agent, or Firm* — Lee & Hayes, PLLC

(57) ABSTRACT

Embodiments provide techniques for identifying unique data elements in data record, removing the unique data elements from the record, storing the record, and employing the removed, unique data as a key in an index into the data storage. When the record is retrieved based on the key in the index, the removed unique data elements is restored. Removal of the unique data elements from the records may enable more efficient compression of the records using compression algorithms that employ an external reference dictionary. In some embodiments, a combination of multiple, removed data elements may be employed as a key. In some embodiments, the removal and use of the unique data as an index key proceeds in a manner that is transparent to the data consuming user, process, or device.

22 Claims, 5 Drawing Sheets

INDEXING STORED DOCUMENTS BASED ON REMOVED UNIQUE VALUES

BACKGROUND

In environments where available data storage is limited, and/or where the amount of data to be stored is large, data compression may enable a larger amount of data to be stored in a database or other data storage of finite size. Certain data compression techniques employ an external reference dictionary to hold data elements that occur frequently across multiple data records. During compression of data records, these compression techniques replace the frequent terms with a reference into the external dictionary, thus reducing the amount of space required to store the records. However, in cases where the records to be compressed include a substantial amount of infrequently occurring data, such compression techniques may be less effective.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Overview

Figure 1:
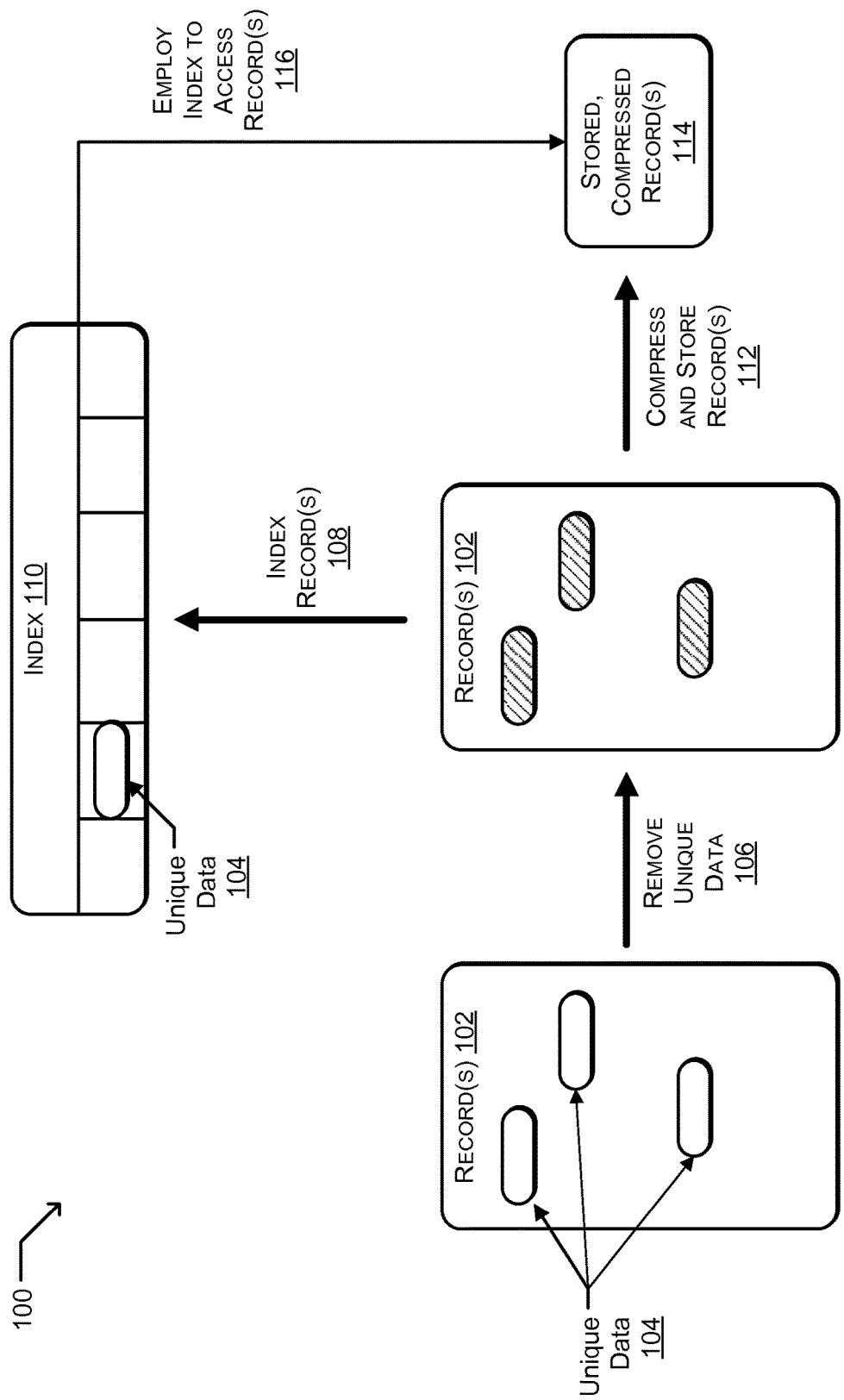
FIG. 1 depicts a diagram of an example process for removing unique data from a record to be stored, and employing the removed data as an index key into the record, according to embodiments.

Embodiments provide techniques for identifying unique data elements in data records, removing the unique data elements from the records, storing the records in a database or other data storage, employing the removed and unique data as a key in an index into the database, and compressing the stored data. Embodiments further provide techniques for retrieving the stored data records based on the key data in the index. For example, a request may be received for one or more records, and the request may specify the respective keys for the requested records. The records may be retrieved and uncompressed, and the previously removed unique data may be restored to those locations in each record from which it was removed. Thus restored to their original content, the retrieved records may then be provided to the requestor. In some embodiments, the removal and use of the unique data as an index key proceeds in a manner that is transparent to the data consuming user, process, or device, such that the data consumer is not aware that the removal and restoration of the unique data has been performed.

In some embodiments, the unique data includes data that uniquely corresponds to a record, such that a record may be identified by the unique data. For example, unique data for a patient's medical record may include an identifier (e.g., a name, address, a social security number, driver's license number, etc.) that is unique to or at least partly correlated with the patient. As another example, unique data for a product description record may include an identification code that uniquely identifies the product, such as a stock-keeping unit (SKU) identifier, International Standard Book Number (ISBN) identifying a particular book, and so forth. In some embodiments, the unique data may be specified along with a request to store a record.

Certain compression techniques employ an external reference dictionary, such as the DEFLATE algorithm used in Gzip™ compression applications. Such compression techniques may achieve higher rates of compression when the files to be compressed include more data that may be replaced with references into the external dictionary (e.g., commonly or frequently occurring data elements in the file). Because embodiments remove the unique data which occurs infrequently in the data records to be stored, such as uniquely identifying data that is specific to a particular file, embodiments may enable higher compression rates, and may thus enable more efficient use of available storage space.

For example, embodiments may enable more efficient storage of records for a catalog of products or services offered by an e-commerce web site. Such catalog records may have many common elements, such as product categories, colors, sizes, dimensions, technical specifications, and the like. However, in some cases a unique identifier for a particular product (e.g., product brand name, model, SKU number, etc.) may be stored in the product record itself. In such cases, because every catalog record has at least one unique data element in it, compression may be less efficient. In another example, data records may include a unique identifier and a data element for which there are few possible values, such as a record that lists eye color along with a personal identifier such as a name. In these and other example scenarios, embodiments may operate to remove the unique information from a record prior to storage and compression, enabling more efficient compression of the record.

FIG. 1 depicts an example schematic process flow diagram 100 for storing a record according to embodiments. As shown in the example, one or more records 102 may include one or more instances of unique data 104. An operation 106 may be performed to remove the unique data, producing a redacted version of each record with the unique data removed. An operation 108 may then be performed to index the records. Such an operation may create or update an index 110 into the database, such that each key element of the index is a unique data element removed from a corresponding record. Because the unique data is specific to a particular record, the unique data may be employed as an index key to be used when accessing or retrieving the particular record.

After the index has been updated or created, one or more operations 112 may compress the data record(s) and store the data record(s) to generate stored, compressed record(s) 114. In some embodiments, creating or updating the index may be performed at least partly in parallel with compression of the record(s). Once the compressed record(s) are stored, ongoing operation(s) 116 may employ the index to access the stored, compressed record(s) 114. Moreover, given that the information (e.g., unique data 104) in the index is used to restore the stored record(s) to their original state when the records are accessed, embodiments may also provide for backing up of the index 110 to safeguard against the possibility that database failures or other failures to lead to a corruption or loss of the index 110.

Illustrative Environment

Figure 2:
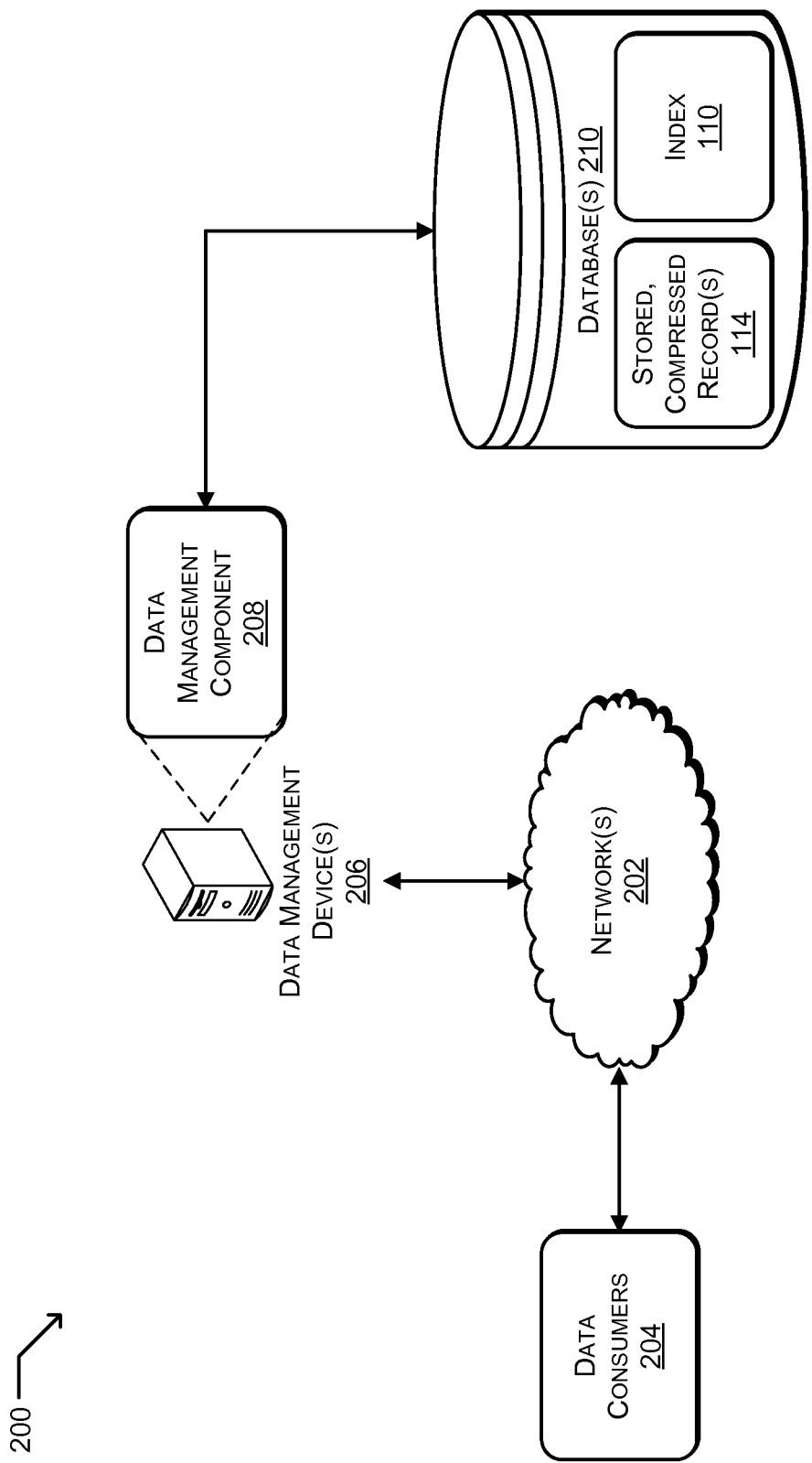
FIG. 2 depicts a diagram of an example environment in which embodiments may operate.

FIG. 2 shows an example environment 200 in which embodiments may operate. In embodiments, the various devices and/or components of environment 200 may communicate with one another and with external devices via one or more networks 202. For example, networks 202 may include public networks such as the Internet, private networks such as an institutional and/or personal intranet, or some combination of private and public networks. Networks 202 may also include any type of wired and/or wireless network, including but not limited to local area networks (LANs), wide area networks (WANs), Wi-Fi, WiMax, and mobile communications networks (e.g. 3G, 4G, and so forth). Networks 202 may utilize communications protocols, including packet-based and/or datagram-based protocols such as internet protocol (IP), transmission control protocol (TCP), user datagram protocol (UDP), or other types of protocols. Moreover, networks 102 may also include a number of devices that facilitate network communications and/or form a hardware basis for the networks, such as switches, routers, gateways, access points, firewalls, base stations, repeaters, backbone devices, and the like.

In some embodiments, environment 200 includes one or more data consumers 204. Such data consumers 204 may include users and/or client devices associated with users. Data consumers 204 may include any type of computing device that is able to communicate with other devices over network(s) 202, including but not limited to desktop computers, personal computers, laptop computers, tablet computers, eBook readers, wearable computers, mobile phones, automotive computers, thin clients, terminals, personal data assistants (PDAs), game consoles, mobile gaming devices, and the like. In some embodiments, data consumers 204 may include applications that request data records to be retrieved from data storage, such as applications that display, analyze, edit, render, and/or print data records.

In some embodiments, data consumers 204 may be internal consumers of data within a business organization, such as business analysts, managers, engineers, customer service representatives, or other users within an organization. In some embodiments, data consumers 204 may be external consumers of data such as customers, potential customers, vendors, partners, and so forth. Moreover, data consumers 204 may also refer to computing devices operated by any of the users described herein, and/or any application executing on such computing devices.

In some embodiments, environment 200 includes one or more server computing devices such as data management device(s) 206. Such server devices may include any type of computing device including, but not limited to, network servers, workstations, desktop computers, laptop computers, tablet computers, mobile computing devices, and the like. Further, the server devices shown may include one or more computing devices that operate in a cluster or other grouped configuration to share resources, balance load, increase performance, provide fail-over support or redundancy, or for other purposes. Moreover, the server devices shown may include one or more hardware components and/or one or more software components (e.g., processes and/or applications) to perform tasks as described herein.

In some embodiments, data management device(s) 206 include one or more components such as data management component 208 that perform data management operations according to embodiments as described herein. For example, data management device(s) 206 and/or data management component 208 may receive requests to store and retrieve data records to and from one or more database(s) 210. Such database(s) 210 may include one or more stored, compressed records 114 that have been compressed according to techniques described herein. Database(s) 210 may also store the index 110 that has been populated with the unique data removed from data records as described herein.

As shown in the example of FIG. 2, data management component 208 communicates with database(s) 210 to store and retrieve record(s), and requests by data consumers 204 for access to the stored record(s) are made via the data management device(s) 206 and/or data management component 208.

Although FIG. 2 depicts a particular example configuration of environment 200, embodiments support other configurations as well. In some cases the tasks performed by data management device(s) 206 may be distributed among multiple devices. For example, a separate device or set of devices may receive requests to stored and/or receive data records from data consumers 204, and such a device (e.g., a front-end server device) may communicate such requests to data management device(s) 206 which then performs operations for removing unique data from records to be stored and/or restoring the previously removed unique data to retrieved records.

Moreover, although the example environment 200 depicts database(s) 210 as external to data management device(s) 206, in some embodiments database(s) 210 may be included on a same device as data management device(s) 206. Further, in some embodiments database(s) 210 may be distributed across a cluster of databases or multiple clusters of data storage devices, such as one or more data warehouses. In some cases, the data records may be distributed to multiple databases based on keys for the data records, such as the unique data removed from the records and employed as index keys. For example, records having keys within a first range may be stored on a first database, records having keys within a second range may be stored on a second database, and so forth.

Illustrative Computing System Architecture

Figure 3:
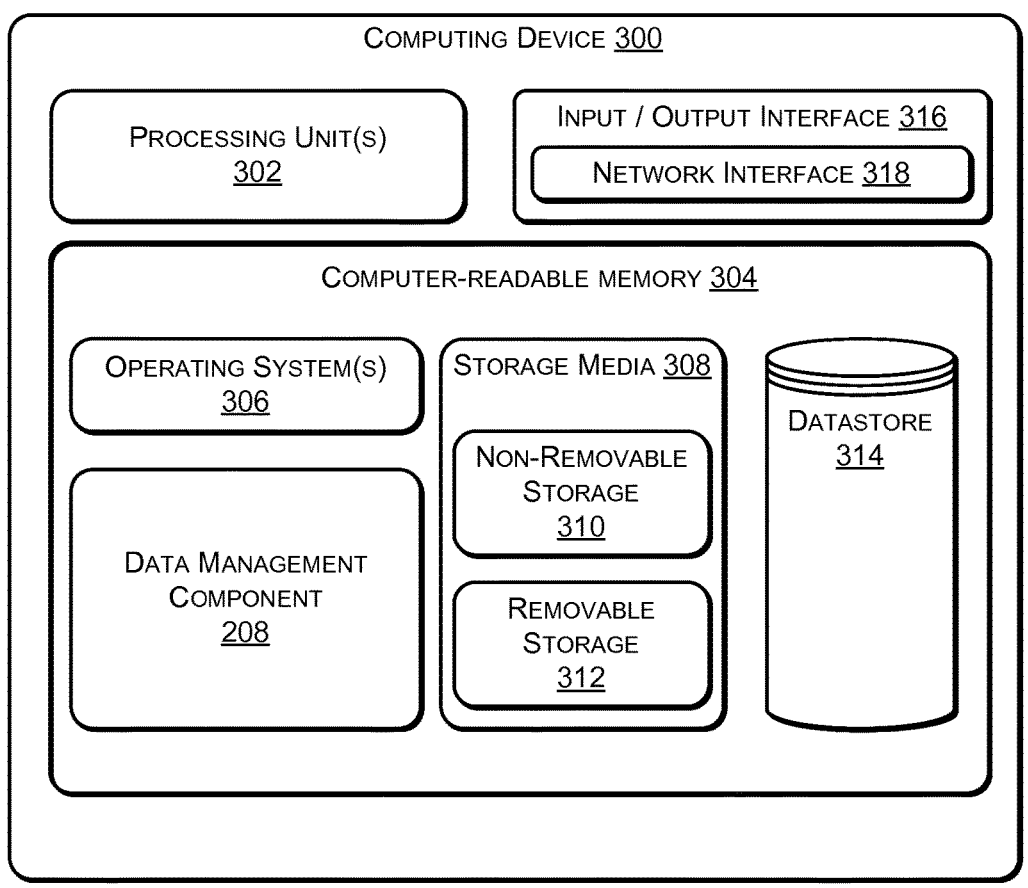
FIG. 3 depicts a diagram of an example computing device which may perform operations for data management, according to embodiments.

FIG. 3 depicts an example computing device 300 that may be used to implement various embodiments described herein. For example, computing device 300 may provide an example system architecture for data management device(s) 206, or other devices. In some embodiments, computing device 300 includes one or more processing units 302. Processing unit(s) 302 may include multiple processing units, and may be implemented as hardware, software, or some combination thereof. Processing unit(s) 302 may include one or more processors. Processing unit(s) 302 may also include computer-executable, processor-executable, and/or machine-executable instructions written in any suitable programming language to perform various functions described herein.

As shown, computing device 300 includes a computer-readable memory 304, which may include volatile memory such as random access memory (RAM), static random access memory (SRAM), dynamic random access memory (DRAM), cache memory, and the like. In some embodiments, computer-readable memory 304 includes one or more executing operating systems (OS) 306, and one or more executing processes including components, programs, or applications that are loadable and executable by processing unit(s) 302. Such processes may include data management component 208 to perform operations as described herein for storing and retrieving data records from storage, removing unique data prior to storage of records, restoring the unique data on retrieval of records, incorporating the unique data as index keys for the stored records, and/or performing data compression and decompression on data records.

As shown in FIG. 3, computer-readable memory 304 may include storage media 308, which may include non-removable storage 310 (e.g., a hard drive) and/or removable storage 312 including magnetic disk storage, optical disk storage, tape storage, storage arrays, storage area networks, network attached storage, cloud storage, and the like. Disk drives and associated computer-readable media may provide non-volatile storage of computer readable instructions, data structures, program modules, and other data for the operation of computing device 300. In some embodiments, computer-readable memory 304 also includes a datastore 314 such as a database or other data storage component to store information for operations of computing device 300. For example, datastore 314 may store data records in a compressed or uncompressed format, unique data elements removed from data records, an index for record access, or other information.

As used herein, computer-readable media includes two distinct types of media: storage media and communications media. With regard to storage media, embodiments may be provided as a computer program product stored on a non-transitory computer-readable or machine-readable storage medium. Computer-readable or machine-readable storage media includes tangible and/or non-transitory forms of media such as volatile and/or non-volatile memory. Such media may be included in a device and/or hardware component that is part of a device or external to a device, including but not limited to random-access memory (RAM), SRAM, DRAM, read-only memory (ROM), erasable programmable read-only memory (EPROM), electrically erasable programmable read-only memory (EEPROM), flash memory, compact disc read-only memory (CD-ROM), digital versatile disks (DVDs), optical cards or other optical storage media, magnetic cassettes, magnetic tape, magnetic disk storage, magnetic cards or other magnetic storage devices or media, solid-state memory devices, or any other non-transmission memory, device, and/or medium that can be used to store and maintain information for access by a computing device. Computer storage media may store information in the form of instruction sets, data structures, applications, program modules and the like, that may be used to program a computing device or processor and thus enable a computing device or processor to perform actions. The stored information may be stored in a compressed or uncompressed form.

In contrast to the tangible storage media described above, communication media is non-tangible (e.g., transitory) and may include data (e.g., computer instruction sets, data structures, program modules, and the like) transmitted in a modulated data signal such as a carrier wave. Embodiments may also be provided as a computer program product including a transitory machine-readable signal (in compressed or uncompressed form). Examples of machine-readable signals, whether modulated using a carrier or not, include but are not limited to signals that a computer system or machine hosting or running a computer program can be configured to access, including signals downloaded through the Internet or other networks. For example, distribution of software may be via Internet download. Thus, tangible computer storage media does not include non-tangible communication media.

Computing device 300 may further include one or more input/output interfaces 316 to allow computing device 300 to communicate with other devices such as user input peripheral devices (e.g., a keyboard, a mouse, a pen, a game controller, a voice input device, a touch input device, gestural input device, and the like), and/or output peripheral devices (e.g., a display, a printer, audio speakers, a haptic output, and the like). Input/output interface 316 may also include one or more network interfaces 318 to enable communications between computing device 300 and other networked devices such as those depicted in FIG. 1. Such network interfaces 318 may include one or more network interface controllers (NICs) or other type of transceiver device to send and receive communications over a network. Computing device 300 may also include one or more busses and/or other internal communications hardware or software that allow for the transfer of data and/or internal communications between the various components of computing device 300.

Moreover, although not depicted in FIG. 3, computing device 300 may further include one or more busses and/or other internal communications hardware or software that allow for the transfer of data and/or internal communications between the various components of computing device 300.

Illustrative Processes

Figure 4:
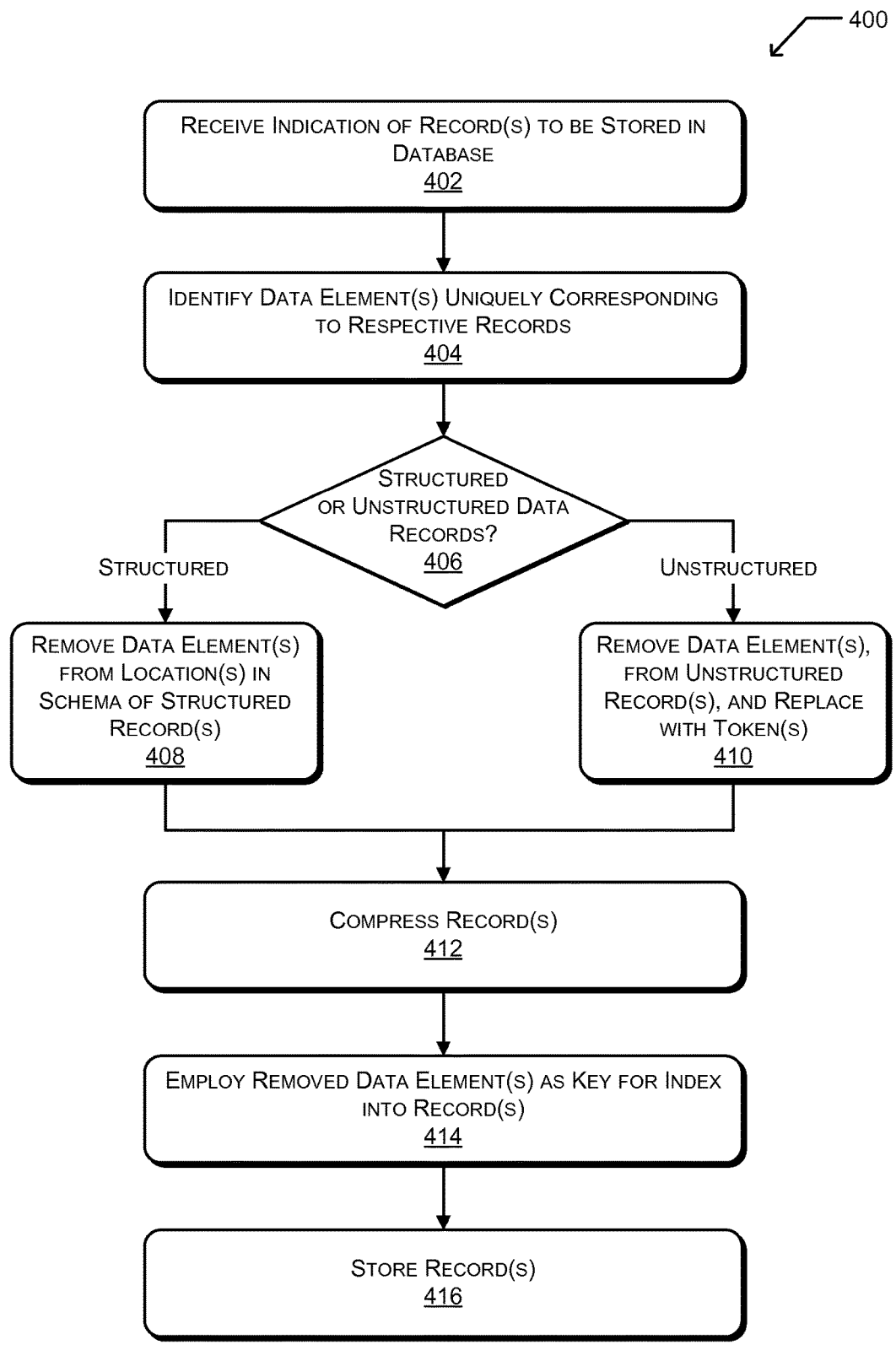
FIG. 4 depicts an illustrative process flow diagram for storing records and indexing records based on unique data removed from the records, according to embodiments.
Figure 5:
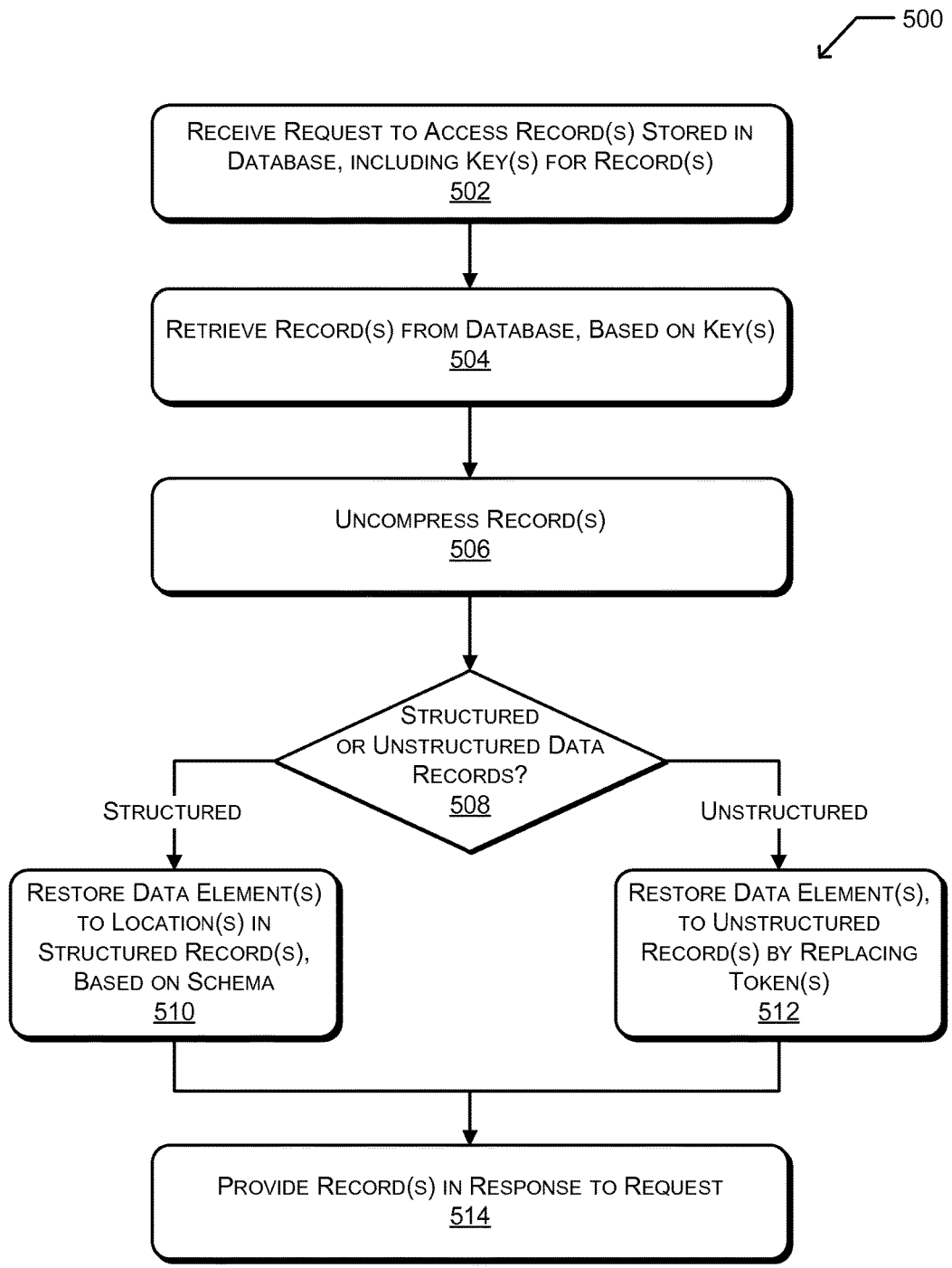
FIG. 5 depicts an illustrative process flow diagram for retrieving records based on an index, according to embodiments.

FIGS. 4 and 5 provide an illustration of embodiments in the form of a flowchart. The operations of the example processes are illustrated in individual blocks and summarized with reference to those blocks. The processes are illustrated as logical flow graphs, each operation of which may represent one or more operations that can be implemented in hardware, software, or a combination thereof. In the context of software, the operations represent computer-executable instructions stored on one or more computer storage media that, when executed by one or more processors, enable the one or more processors to perform the recited operations. Generally, computer-executable instructions include routines, programs, objects, modules, components, data structures, and the like that perform particular functions or implement particular abstract data types. The order in which the operations are described is not intended to be construed as a limitation, and any number of the described operations may be executed in any order, combined in any order, subdivided into multiple sub-operations, and/or executed in parallel to implement the described process.

FIG. 4 depicts a flow diagram of an illustrative process 400 for storing data records and indexing the data storage using keys based on removed unique data. In some embodiments, one or more operations of process 400 may be executed on data management device(s) 206 and/or performed by data management component 208. At 402, an indication may be received of one or more records to be stored in a database or other data storage. In some embodiments, the indication may be a request from a data consumer, data provider, or other entity to store data records in a database.

Embodiments support any type of data record in any format and for any use. For example, data records may be stored for use in an e-commerce environment, and may describe products and/or services available for purchase. Data records may also include records of personal data, such as medical records, financial records, and the like. The data records or documents received may include structured or unstructured text documents, audio files, video files, multimedia files, image files, graphics files, computer program source code, computer program executable files, or other types of documents.

In some cases the database may employ a storage system that enables records to be stored at least in part without a schema or other fixed data model within the database, such as a hash table or a key-value store. For example, the database may be based on the NoSQL database management system or may otherwise not adhere to the Relational Database Management System (RDBMS) model. Some embodiments may employ the Oracle® Berkeley DB® software library for a database. However, embodiments are not so limited and other types of databases may be supported. For example, the database may be a relational database that conforms to the RDBMS model, has a fixed schema or data model, and/or that uses a form of Structured Query Language (SQL) as its query language. Other data models may be employed, including but not limited to hierarchical models, network models, entity-relationship models, object models, object relational models, and so forth.

At 404, one or more data elements are identified for the one or more records to be stored. In some embodiments, the data elements identified are unique data elements, e.g. data elements that uniquely correspond to their respective records and are not associated with other records. For example, where the records are medical or financial records, the unique data elements may include an identifier of the individual (e.g., a SSN). As another example, where the records are data records describing products or services for sale by an e-commerce business, the unique data elements may include product or service identifiers such as a product SKU, ISBN, or other identifier.

In some embodiments, the unique data elements are identified within the request received to store the data records. In other embodiments, the data records may be analyzed to identify the unique data elements in each record. For example, in some cases the data records received may be structured and may include metadata such as Extensible Markup Language (XML) metadata that identifies certain data elements within the record. In such cases, the unique data elements may be identified based on the included metadata or other data structure. In some embodiments, an analysis of the data records received may be performed to identify data that occurs in the records at a frequency that is below a predetermined threshold frequency (e.g., data elements that occur no greater than once across multiple records), and such data elements may be identified as unique data elements.

At 406, a determination is made whether each record is a structured data record or an unstructured data record. As described above, in some cases the data records to be stored may include structured data, e.g., data that is structured based on included metadata such as an XML schema. If a determination is made that the data records are structured data records, then at 408 one or more instances of the unique data element(s) identified at 404 are removed from the records, based on the schema of the structured records. For example, where a determination is made that the data element "Product ID" is a unique data element, instances of that data may be removed from the record according to the location of one or more metadata tags <ProductiD>.

If a determination is made at 406 that the data records are unstructured, then at 410 one or more instances of the unique data element(s) identified at 404 are removed from the unstructured records, and replaced with tokens indicating the locations of the unique data element(s) in the original record. Such tokens enable the unique data elements to be restored to their original locations in the record when the record is retrieved from data storage. Embodiments may support any type of token suitable for this purpose, and the token may be predetermined as a string or other data that is unlikely to be present in the original data records (e.g., "$$ID"). In some embodiments, the data records may be scanned to determine if the original file already includes any instances of the token to be used, and in such cases the existing instances of the token may be escaped (e.g., prepended with additional, predetermined escape character(s)), to prevent the restoration process from mistakenly restoring the unique data element that location.

At 412 the stored data records may be compressed. In some embodiments, the compression algorithm may employ an external reference dictionary (e.g., such as DEFLATE). In such cases, removal of the unique or infrequent data elements from the data records prior to their storage may enable more efficient compression of the records. In some cases, the compression reference dictionary may be versioned so that, if the stored data evolves over time, the dictionary may be regenerated periodically over time to ensure effective compression. In such cases, the stored record may be associated with a particular dictionary version number, to ensure proper decompression of the record.

At 414 the removed, unique data elements may be employed as a key for an index into the records. For example, where a unique data element "123XYZ" was identified for a record, that data element "123XYZ" may be used as a key to that record in the index.

Further, in some embodiments, the index key for a data record may be a compound key that is a combination of one or more unique (or otherwise infrequent) data elements in the record. For example, in a scenario where the data records are medical records for individuals, the key may be a combination of the individual's full name and SSN, e.g., "John Doe 123456789." In such cases, the order, length, and/or data type of the various components of the compound key may be stored to enable the key value to be correctly parsed when the unique data elements are restored to the data record on its retrieval. Where the data records are unstructured records, multiple replacement tokens may be employed, one for each of the unique data elements removed from the record and combined to form the key.

In some embodiments, the compression of record(s) at 412 and the creation of the index at 414 may be performed at least partly in parallel. At 416, the compressed record(s) are stored in the database or other data storage. The index may then be used to access the stored records.

FIG. 5 depicts a flow diagram of an illustrative process 500 for retrieving data records previously stored as described with regard to FIG. 4. In some embodiments, one or more operations of process 500 may be executed on data management device(s) 206 and/or performed by data management component 208.

At 502, a request is received to access one or more records stored in the database. In some embodiments, the request includes the key for each of the requested records. At 504, each requested record is retrieved from the database based on its key in the index. At 506, each retrieved record is uncompressed, using an algorithm corresponding to the compression algorithm used to compress the records at 416.

At 508, a determination is made whether the records are structured or unstructured. If they are structured, then at 510 the unique data element(s) from the key are restored to the record based on the structure of the record (e.g., based on a metadata schema such as XML). If they are unstructured records, then at 512 the unique data element(s) from the key may be restored to the record by replacing all instances of the token in the record with the unique data element. In cases where multiple unique data elements were combined to form the key, the key may be parsed and divided into its constituent data elements, and each data element restored to a location in the record based on a particular token (for unstructured records) or based on the metadata schema (for structured records).

At 514, the requested data records, having been uncompressed and restored with their unique data element, are provided to the requesting data consumer in response to the request. In some embodiments, the key may also be provided with the requested data records in the response to the request. Moreover, in some cases, the key provided in the response may be different from the key that was provided by the data consumer in the original request for the record(s), e.g. in cases where the index has been altered.

In some embodiments, the processes described with reference to FIGS. 4 and 5 may be performed by an intermediary process that is interposed between data requestor and database, and the processes may be performed in a way that is transparent to the data consumer such that the user, device, and/or process requesting the records is not aware that the operations for removing and replacing the unique data elements have been performed.

In some cases, there may be a performance cost incurred in either or both of the data storage and data retrieval processes described above, given the operations of respectively removing and restoring the unique data elements from the records. Accordingly, some embodiments may employ low-cost serialization methods that allow the value removal and restoration to be performed with minimal cost. For example, in some cases it may be the case that the documents to be stored have their key information (e.g., their unique identifying data) at the very head of the document, and/or keys are present in the top-leveled attributes of an XML-structured document. In such cases, the document may be restored by performing a low-cost concatenation operation that streams the key information followed by the remaining record payload.

Moreover, in some cases the compression may be performed such that record sizes may be reduced to at or below a block size for the device running the process. In such cases, Input/Output (I/O) performance gains may make up for some or all of the performance degradation caused by the unique data removal and restoration, and in some cases may even realize a performance benefit to the data consumer.

CONCLUSION

Although the techniques have been described in language specific to structural features and/or methodological acts, it is to be understood that the appended claims are not necessarily limited to the specific features or acts described. Rather, the specific features and acts are disclosed as example implementations of such techniques.

What is claimed is:

1. A computer-implemented method comprising:
   receiving an indication of one or more records to be stored in a compressed format in at least one database;
   identifying, within a first record of the one or more records, at least one first data element that identifies the first record;
   identifying, with a second record of the one or more records, at least one second data element that identifies the second record;
   removing the at least one first data element from the first record;
   removing the at least one second data element from the second record;
   selecting a token;
   subsequent to removing the at least one first data element and removing the at least one second data element, scanning the one or more records;
   in response to the scanning, determining that the one or more records includes the token;
   in response to determining that the one or more records includes the token, modifying the token to create a modified token, the modified token being different than the token;
   replacing the at least one first data element with the modified token in the first record and replacing the at least second data element with the modified token in the second record;
   subsequent to replacing the at least one first data element with the modified token and replacing the at least one second data element with the modified token, compressing the first record and the second record to obtain one or more compressed records, using a compression algorithm that employs a reference dictionary;
   storing the one or more compressed records in the at least one database;
   generating a first key using the at least one first data element;
   generating a second key using the at least one second data element; and
   storing the first key and the second key in an index in the at least one database storing the one or more compressed records.

2. The method of claim 1, further comprising employing the index to access the one or more compressed records stored in the at least one database.

3. The method of claim 1, wherein the at least one first data element includes two or more data elements, and wherein a combination of the two or more data elements is employed as the first key in the index.

4. The method of claim 1, further comprising:
   receiving a request to access the first record;
   retrieving the requested first record, based on the first key;
   uncompressing the first record; and
   restoring the at least one first data element to one or more locations that include the modified token.

5. The method of claim 1, wherein the modified token is an alternate token that is created based at least in part on the token.

6. The method of claim 1, wherein modifying the token includes:
   adding one or more characters to the token to create the modified token.

7. The method of claim 1, wherein modifying the token includes:
   prepending the token with one or more pre-determined escape characters to create the modified token.

8. One or more non-transitory, computer readable storage media storing instructions that, when executed, instruct at least one processor to perform actions comprising:
   receiving an indication of one or more records to be stored in a compressed format in at least one database;
   identifying, within a first record of the one or more records, at least one first data element that identifies the first record;
   identifying, with a second record of the one or more records, at least one second data element that identifies the second record;
   removing the first data element from the first record;

removing the second data element from the second record;
determining a token;
subsequent to removing the at least one first data element and removing the at least one second data element, scanning the one or more records;
in response to the scanning, determining that the one or more records includes the token;
in response to determining that the one or more records includes the token, modifying the token to create a modified token, the modified token being different than the token;
replacing the first data element with the modified token in the first record and replacing the second data element with the modified token in the second record;
subsequent to replacing the first data element and replacing the second data element with the modified token, compressing the one or more records to obtain one or more compressed records;
storing the one or more compressed records in the database;
employing the first data element as at least a portion of a first key in an index into the database, the first key being associated with the first record;
employing the second data element as at least a portion of a second key in the index, the second key being associated with the second record; and
storing the first key and the second key in an index in the database storing the one or more compressed records.

9. The one or more computer-readable storage media of claim 8, wherein compressing the one or more records is based on a compression algorithm that employs an external reference dictionary.

10. The one or more computer-readable storage media of claim 9, wherein the compression algorithm is a DEFLATE algorithm.

11. The one or more computer-readable storage media of claim 8, wherein the one or more records are structured records with a predetermined schema, and wherein removing the first data element and the removing the second data element includes removing the first data element and the second data element from at least one location in the predetermined schema.

12. The one or more computer-readable storage media of claim 8, wherein the actions further comprise:
determining that the first data element appears less than a threshold number of times in the first record; and
determining that the second data element appears less than a threshold number of times in the second record,
wherein removing the first data element and removing the second data element is in response to determining that the at least one data element appears less than the threshold number of times in individual ones of the one or more records.

13. The one or more computer-readable storage media of claim 8, wherein the actions further comprise:
retrieving at least one compressed record from the database based on the first key, after receiving a request for the first record;
uncompressing the first record;
restoring the first data element to one or more locations in the first record from which the first data element was removed; and
providing the first record in response to the request.

14. The one or more computer-readable storage media of claim 13, wherein:
the one or more records are structured records with a predetermined schema;
removing the first data element includes removing the first data element from at least one location in the predetermined schema; and
restoring the first element includes restoring the first data element to the at least one location in the predetermined schema.

15. A system comprising:
one or more memories;
one or more processors in communication with the one or more memories; and
a data management component stored in the one or more memories and executable by the one or more processors to perform acts to:
identify at least one data element in one or more documents to be stored in a database, the at least one data element uniquely correlated to a respective document;
generate a token to replace the at least one data element in individual ones of the one or more documents;
determine whether the individual ones of the one or more documents include the token;
in response to determining that the one or more documents do not include the token, replace the at least one data element with the token;
in response to determining that the one or more documents include the token, replace the at least one data element with a modified token, the modified token being different from the token;
subsequent to replacing the at least one data element with the token or with the modified token, compress the one or more documents to obtain one or more compressed documents;
store the one or more compressed documents in the database; and
employ the at least one data element that was removed as at least a portion of a key in an index into the database.

16. The system of claim 15, wherein the one or more documents include at least one of text, an image, a graphic, audio content, or video content.

17. The system of claim 15, wherein the one or more documents are unstructured documents.

18. The system of claim 15, wherein compressing the one or more documents is by a compression algorithm that employs an external reference dictionary.

19. The system of claim 15, wherein the at least one data element includes two or more data elements, and wherein a combination of the two or more data elements is employed as the key in the index.

20. The system of claim 15, wherein the acts further include scanning the one or more documents for instances of the token prior to replacing the at least one data element with the token and in response to instances of the token in the one or more documents, modifying the instances of the token within the one or more documents.

21. The system of claim 20, wherein modifying the instances of the token within the one or more documents includes prepending predetermined escape characters to the instances of the token.

22. The system of claim 15, wherein the token is a predetermined string.

* * * * *